United States Patent

[11] 3,560,812

[72] Inventors Robert N. Hall
Schenectady;
Richard D. Baertsch, Scotia; John R. Richardson, Schenectady, N.Y.
[21] Appl. No. 742,655
[22] Filed July 5, 1968
[45] Patented Feb. 2, 1971
[73] Assignee General Electric Company
a corporation of New York

[54] HIGH SELECTIVITY ELECTROMAGNETIC RADIATION DETECTING DEVICES
4 Claims, 3 Drawing Figs.

[52] U.S. Cl. ........................................................ 317/234, 317/235
[51] Int. Cl. ........................................................ H01l 15/00, H01l 5/00
[50] Field of Search ........................................................ 317/235/31, 235/27, 235/48.4, 237

[56] References Cited

UNITED STATES PATENTS

| | | | |
|---|---|---|---|
| 3,049,622 | 8/1962 | Ahlstrom | 250/211 |
| 3,450,957 | 6/1969 | Saxena | 317/234 |

OTHER REFERENCES

Schneider, " Schrottky Barrier Photodiodes With Antireflection Coating," BELL SYSTEM TECHNICAL JOURNAL, Nov. 1966. Pages 1611— 1637.

Kano et al., JOURNAL OF APPLIED PHYSICS, 37, 8 July 1966 pages 2985— 2987

*Primary Examiner*—John W. Huckert
*Assistant Examiner*—Martin H. Edlow
*Attorneys*—Richard R. Brainard, Marvin Snyder, Paul A. Frank, Frank L. Neuhauser, Oscar B. Waddell and Melvin M. Goldenberg

ABSTRACT: A high selectivity solid-state radiation detector having a Schottky barrier-type junction is fabricated by depositing a thin silver film of prescribed thickness atop a semiconductor crystal to form a sharp silver-to-semiconductor interface. The film allows a narrow band of the electromagnetic radiation incident thereon to pass therethrough into the semiconductor. Such radiation band is at an energy which is greater than the energy gap of the semiconductor and is thereby strongly absorbed, producing electron-hole pairs within the space-charge region of the barrier and giving rise to a photoelectromotive force or photoconductivity that peaks at an energy of radiation greater than the energy gap. If the radiation transmitted by the silver film is of energy less than the band gap of the semiconductor it is only weakly absorbed in the semiconductor, and therefore produces negligible response. By varying the film thickness, the selectivity and peak sensitivity may be further controlled.

PATENTED FEB 2 1971 3,560,812

Inventors:
Robert N. Hall,
Richard D. Baertsch,
John R. Richardson,
by Marvin Snyder
Their Attorney.

HIGH SELECTIVITY ELECTROMAGNETIC RADIATION DETECTING DEVICES

INTRODUCTION

This invention relates to electromagnetic radiation detecting devices, and more particularly to a semiconductor electromagnetic radiation detector coated with a metallic film to form a selective radiation filter for the device.

Need has long existed for radiation sensors which are responsive to ultraviolet light in a particular bandwidth and yet are substantially insensitive to visible and infrared light. For example, a rugged flame detector responsive only to the ultraviolet portion of the electromagnetic radiation in the spectrum emitted by a flame would be highly desirable in monitoring furnace operation. This ultraviolet emission is in the spectral energy range of 3.5—4 electron volts. Heretofore, ultraviolet detectors have operated by virtue of photoemission of electrons from metal electrodes. Such detectors are somewhat selective in that they are relatively insensitive to visible radiation; however, they suffer from inability to filter out, and thereby be unresponsive to, the higher energy radiation extending into the far ultraviolet region. Although silicon carbide PN junction devices have been suggested for this function, their sensitivity is quite low and, since they respond to spectral energy as low as 3 electron volts, they are not sufficiently selective to perform such function satisfactorily.

One object of the invention is to provide an electromagnetic radiation detector of high sensitivity and selectivity.

Another object is to provide an electromagnetic radiation detector having a thin metallic film thereon to produce a Schottky barrier in the detector and filter unwanted wavelengths out of incident electromagnetic radiation.

Another object is to provide a method of making an electromagnetic radiation detector of high sensitivity over a predetermined radiation bandwidth.

Another object is to provide a method of preventing a reaction between a thin silver film atop a semiconductor crystal in a solid-state electromagnetic radiation detector, without detrimentally affecting the response characteristics of the detector.

In R.D. Baertsch application Ser. No. 742,654 filed concurrently herewith and assigned to the instant assignee, a solid-state X-ray and atomic particle detector comprising a high atomic number semiconductor coated with a thin film of metal of low atomic number so as to form a surface barrier or Schottky-type semiconductor junction is described and claimed. The present invention, however, is directed to a surface barrier or Schottky-type semiconductor junction, made by depositing a thin film of silver or other appropriate metal atop a semiconductive crystal of predetermined conductivity type, which may comprise zinc sulfide or gallium arsnide, for example. The silver film exhibits minimum absorption and reflection of electromagnetic radiation near 3.85 electron volts (3,220 angstroms in wavelength), but strongly attenuates radiation outside this band, and particularly less energetic radiation, both by reflection and by absorption. These properties are discussed in Optical Properties of Ag and Cu by H. Ehrenreich et al., The Physical Review, Vol. 128, pages 1622-—1629 (1962). The class of metals known as sodium tungsten bronzes, which comprise alloys of $WO_3$ and Na, have similar properties and are capable of having their transmissivity peaks shifted to a desired wavelength by selecting the proper concentration of sodium in the alloy. Transition metal oxides, such as rhenium oxide also display a transmissivity peak, and are sufficiently conductive to form a metallic contact to a semiconductor. Thus, by allowing a electromagnetic radiation extending over the spectrum to fall upon the thin metallic film, some of the incident radiation passes through the film into the semiconductor. By varying the film thickness, it is possible to obtain varying degrees of selectivity and peak sensitivity.

If the radiation transmitted by the film is of energy greater than the energy gap of the semiconductor, it is strongly absorbed in the semiconductor, producing electron-hole pairs within the space-charge region of the Schottky barrier. This gives rise to a photoelectromotive force or photoconductivity. Radiation transmitted by the film but of energy less than the band gap of the semiconductor is only weakly absorbed by the semiconductor, and produces negligible response. Thus, the detector of the present invention employs a combination of two different phenomena: the photoresponse peak of the semiconductor Schottky barrier, and the maximum transmissivity to predetermined radiation energy provided by the thin metallic film. This results in a highly selective radiation detector over a desired spectral region.

Briefly, in accordance with a preferred embodiment of the invention, a high selectivity electromagnetic radiation detection device is described. The device comprises a semiconductive crystal of predetermined conductivity type, and a metallic film, such as silver of predetermined thickness, coated atop the crystal to form an abrupt metal-to-semiconductor interface with minimal diffusion of the metal into the semiconductor.

In accordance with another preferred embodiment of the invention, a method of fabricating a high selectivity electromagnetic radiation detecting device is described. The method comprises making ohmic contact to one surface of the semiconductor, etching the opposite surface of the semiconductor, and evaporating a film of silver onto the etched surface of the semiconductor for a pedetermined interval while maintaining the semiconductor at a temperature in a predetermined range.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DESCRIPTION OF TYPICAL EMBODIMENTS

Figure 1:
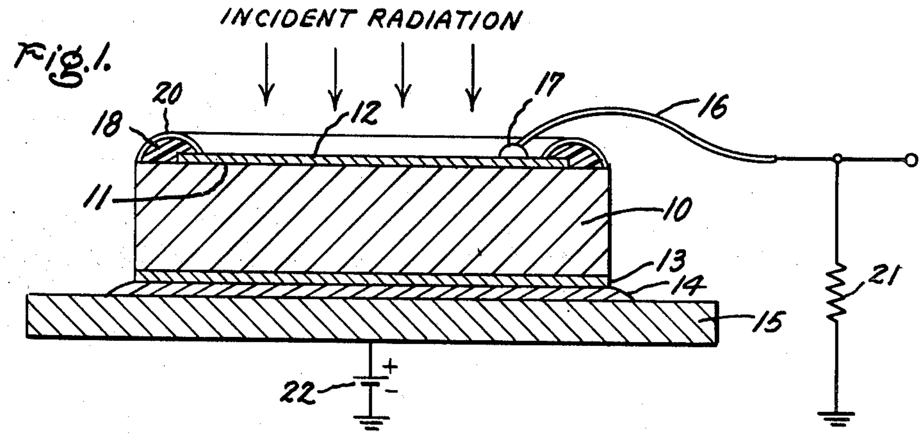
FIG. 1. Is a cross-sectional view of a first embodiment of the electromagnetic radiation detecting device of the instant invention showing a selectively transmissive metallic film in contact with a semiconductive crystal.

In FIG. 1, a semiconductor crystal 10 is shown having a thin metallic film 12 coated thereon so as to form a distinct, abrupt metal-to-semiconductor interface 11. Semiconductor wafer 10 is preferably of N-type conductivity, and may comprise a suitable photosensitive semiconductor such as, for example, silicon, zinc sulfide, zinc selenide, cadmium sulfide, silicon carbide, gallium phosphide or gallium arsenide. In the alternative, semiconductor wafer 10 may be of P-type conductivity. Metallic film 12 is preferably comprised of a material exhibiting a sharp drop in optical absorption coefficient at incident radiation energy above the energy gap of the semiconductor. The energy gap of zinc sulfide at room temperature is about 3.7 electron volts, while that for gallium arsenide is about 1.38 electron volts. Thus, silver is a convenient material for metallic film 12, since it is nearly transparent to radiation in a narrow spectral region about 3.85 electron volts energy but strongly attenuates radiation outside this range both by reflection and by absorption; that is, silver layer 12 has the properties of being highly absorbing in the visible, infrared and for ultraviolet regions of the optical spectrum, and being highly transmissive in a narrow band of wavelengths centered about 3,220 angstroms. However, if small band gap semiconductors were to be used in fabricating the device the height of the Schottky barrier would be small, resulting in low impedance at zero bias, of the diode formed at the metal-to-conductor interface. This would produce an unacceptably low signal-to-noise ratio.

Silver layer 12 is applied to the device at a sufficiently low temperature to avoid the possibility that diffusion of silver atoms into the semiconductor may occur, in order to preclude any possibility of making an ohmic contact between layer 12 and semiconductor 10. If the metallic layer is evaporated onto semiconductor wafer 10 in this fashion, a barrier layer, often referred to as a Schottky barrier, is produced in the semiconductor; that is, a discontinuity exists in energy levels at the metal-to-semiconductor interface while the Fermi levels of the materials, at zero bias, are identical. This results in a depletion region in the semiconductor at interface 11. A detailed description of such barrier layers is presented, for example, in Metal-Semiconductor Surface Barriers by C.A. Mead, Solid State Electronics, Vol. 9, pages 1023—1033 (1966).

An ohmic contact 13 is made to wafer 10 on the wafer surface opposite interface 11 and the wafer is then soldered through a layer of indium 14 to a header 15 of Kovar, which comprises an alloy of 17—18 percent cobalt, 28—29 percent nickel, and the remainder iron. Contact to silver layer 12 may be made through a platinum wire 16 adhered to the silver layer through silver paste 17, such as electronic grade 4817 silver preparation manufactured and sold by E.I. duPont de Nemours and Co., Wilmington, Del. To prevent absorption of visible radiation near the interface of silver layer 12 and semiconductor wafer 10, the periphery of silver layer 12 may be coated with black wax 18, such as Apiezon W, which in turn is covered with black paint 20. The detector may be operated at a reverse bias, so that a positive bias may be supplied to header 15 from a DC source 22. Radiation transmitted through silver film 12, which is of energy greater than the energy gap of the semiconductor, is strongly absorbed in the narrow depletion layer of the Schottky barrier, creating electron-hole pairs therein. This causes a current to flow when a circuit is completed between lead 16 and header 15, as through a load resistance 21. Less energetic radiation is only weakly absorbed, and produces negligible response. Output signals produced across load resistance 21 may be furnished to utilization apparatus (not shown). Alternatively, the detector may be operated without DC source 22, in which case it functions as a photovoltaic generator.

Additional spectral selectivity is provided by silver film 12, since silver exhibits minimum absorption and reflectance, and hence maximum transmissivity, to radiation near 3.85 electron volts in energy; however, the silver strongly attenuates both more and less energetic radiation. By properly selecting the thickness of the silver film, different degrees of selectivity and peak sensitivity may be obtained. For example, as the thickness of the film is increased, absorption in the film increases so that the peak sensitivity is decreased. Selectivity, on the other hand, increases as thickness is increased, in accord with the behavior of the absorption coefficient described in the aforementioned H. Ehrenreich et al. paper. It is evident, therefore, that in obtaining controllable selectivity and peak sensitivity, two different phenomena are employed. One phenomenon is the photoresponse peak provided by the Schottky barrier at the metal-to-semiconductor interface. The second phenomenon is the transparency to radiation near a predetermined wavelength, provided by the silver film.

When employing the device as a flame detector in a furnace, it is preferable that the device be optically coupled to the end of a light pipe, such as a quartz rod (not shown) in order to conduct electromagnetic radiation from the source to the device. This permits the device to be situated at a distance from the furnace, thereby avoiding exposure of the device to detrimental, excessively high temperatures.

As one example of how the device of FIG. 1 may be fabricated, an ingot of N-type gallium arsenide having a donor concentration between $5 \times 10^{15}$ and $5 \times 10^{17}$ atoms per cubic centimeter is cut, lapped and polished by conventional techniques into wafers 125 to 500 microns in thickness. Thereafter, a film of silver, typically 5,000 angstroms in thickness is evaporated onto one side of a wafer to form ohmic contact 13. The rate at which the silver is deposited on the wafer may be monitored by measuring the change in resonant frequency of a quartz crystal, situated near the wafer, connected in an oscillator circuit as silver molecules accumulate thereon. Details of this evaporation rate monitoring technique are set forth in J.R. Richardson application Ser. No. 631,775 filed Apr. 18, 1967 and assigned to the instant assignee. Following the evaporation, the wafer is heated at a temperature of about 450° C. in a hydrogen atmosphere for about 30 seconds to allow the silver to form an ohmic contact with the gallium arsenide wafer. The opposite side of the wafer is then lapped and etched in a solution of 1 percent bromine in methanol for about 30 minutes to remove surface damage. Silver is then evaporated onto the etched surface of the wafer at a substrate temperature between 20° C. and 200° C., conveniently about 150° C. This evaporation is preferably performed through a mask in order to prevent the silver film from short the diode at interface 11 by overlapping onto the sides of the wafer. The thickness of the silver is preferably about 2,000 angstroms, in order to optimize transmission through the silver of electromagnetic radiation of 3,220 angstroms wavelength while maintaining low transmission therethrough in the visible, infrared and far ultraviolet portions of the spectrum. The wafer is then soldered onto a Kovar header with indium solder, so as to avoid the necessity for heating the wafer to a temperature at which the electromagnetic radiation transmissive layer of silver diffuses into the gallium arsenide. Contact to the radiation transmissive silver layer is made with silver paste and a platinum wire. Finally, the periphery of the radiation transmissive silver layer is coated with Apiezon W black wax, and the black wax is covered with black paint in order to prevent radiation from being absorbed by the gallium arsenide at the periphery of silver-to-gallium arsenide interface 11.

Figure 2:
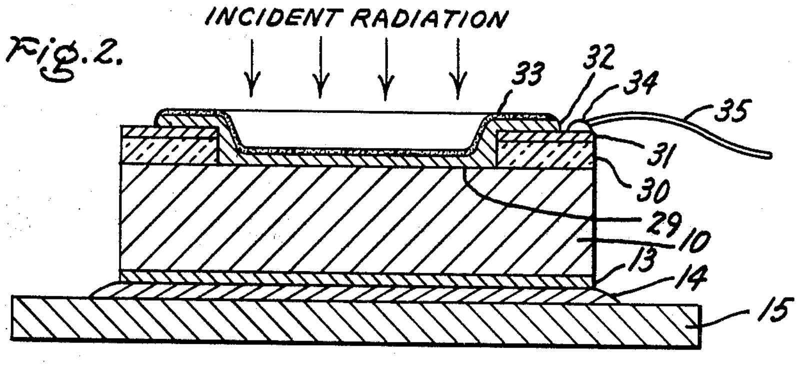
FIG. 2 is a cross-sectional view of a second embodiment of the electromagnetic radiation detecting device of the instant invention wherein an antioxidation layer is included over the selectively transmissive metallic film.

FIG. 2 illustrates a second embodiment of the radiation detecting device of the invention. The radiation responsive surface of this embodiment of the device is coated with a silver layer 32 through which electromagnetic radiation of the desired wavelength passes. However, semiconductor crystal 10 is coated with an annulus of electrically insulating material, such as silicon dioxide 30, around its incident radiation receiving surface. Insulator 30, in turn, is coated with an annulus of aluminum 31. Silver layer 32 is deposited atop the radiation responsive surface of wafer 10 to form an abrupt interface 29 therewith, thereby providing a Schottky barrier in the manner described in conjunction with the embodiment of FIG. 1. A magnesium fluoride film 33 is coated over silver layer 32, if desired, in order to prevent tarnishing of the silver layer while yet permitting passage of electromagnetic radiation therethrough at the wavelength to which the device is to be responsive. Electrical contact is made to silver layer 32 through a wire 35 bonded to aluminum annulus 31. This structure obviates the need for use of black wax and black paint around the edge of the silver layer forming the Schottky barrier interface, since aluminum layer 31 is of sufficient thickness to be opaque to the incident electromagnetic radiation.

Devices as illustrated in FIG. 2 are fabricated in a manner essentially identical to that described for the devices of FIG. 1, through the ohmic contact forming step. Thus, assuming again that crystal 10 comprises N-type gallium arsenide, a silver layer 13 is evaporated onto the lower surface of the crystal to make ohmic contact therewith and to permit subsequent soldering of the device through indium solder 14 to header 15. Once silver layer 13 has been applied to crystal 10 in the manner previously described, an insulator, such as silicon dioxide, is deposited onto the opposite surface of the wafer to a thickness typically about 5,000 angstroms, with the wafer maintained at a temperature of 300° C. Thereafter, an aluminum layer of about 2,000 angstroms in thickness is evaporated atop the insulating layer at a temperature of about 150° C. By use of conventional photoresist techniques, a hole is etched through the aluminum layer with an etchant comprising, by volume, 25 parts phosphoric acid, 2 parts acetic acid, 1 part nitric acid, and 5 parts water, leaving an annulus 31 of aluminum, an a hole is next etched through the silicon dioxide layer with an etchant comprising, by volume, 10 parts 40 percent ammonium fluoride and 1 part hydrofluoric acid, leaving an annulus 30 of silicon dioxide. Silver layer 32 is thereafter evaporated to a thickness of about 2,000 angstroms onto the exposed surface of wafer 10 and over the remainder of the aluminum layer while the device is maintained at a temperature between 20° C. and 200° C., conveniently about 150° C. A tarnish preventing layer of magnesium fluoride 33 is then evaporated over silver layer 32, if desired, at a temperature of 150 C., to a thickness which minimizes the amount of radiation reflected from the device at the transmission peak of the silver. The wafer is then mounted on Kovar header 15 through indium solder 14, and an electrical connection is made to silver layer 32 by bonding a wire 35 to aluminum annulus 31.

Figure 3:
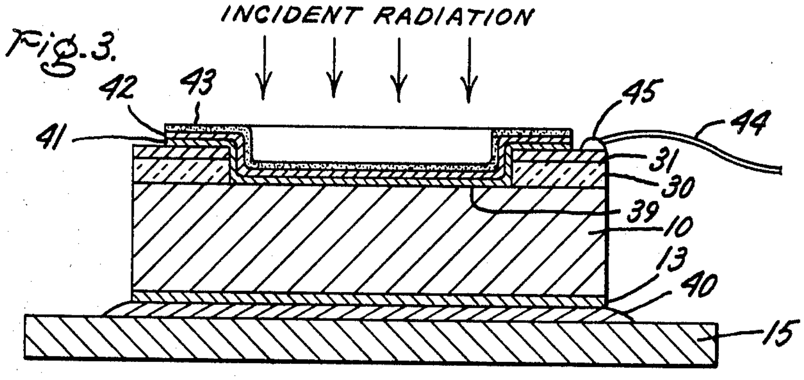
FIG. 3 is a cross-sectional view of a third embodiment of the electromagnetic radiation detecting device of the instant invention wherein a metallic film is interposed between the selectively transmissive metallic film and the semiconductor.

The detector of FIG. 3 represents a third embodiment of the invention, intended for use in a higher temperature environment than the devices of FIGS. 1 and 2. At temperatures above a predetermined level, a reaction between silver and the substrate semiconductor occurs. This reaction can be detrimental to operation. For example, at temperatures above approximately 250° C., a reaction between silver and gallium arsenide occurs, degrading the electrical rectifying characteristics at the radiation receiving silver-to-gallium arsenide interface. To overcome this problem, a thin metal layer may be employed between the silver and the semiconductor so that the Schottky barrier at the metal-to-semiconductor interface is formed by this intervening metal layer and the semiconductor instead of by the silver and the semiconductor. The intervening metal layer thus separates the silver from the semiconductor, preventing any reaction therebetween. The metal employed between the silver and the semiconductor is required to be capable of forming a continuous film at very small thicknesses, such as between 50 and 200 angstroms, in order to maintain high radiation transmissivity through the metal. In addition, the metal should not alloy or react with either the semiconductor or the silver at temperatures at least as high as 200° C. Metals which meet the foregoing requirements include platinum, tungsten, molybdenum and chromium.

Fabrication of a device typical of that illustrated in FIG. 3 is somewhat similar to that of the device of FIG. 2 in that silver layer 13 is first formed on the lower surface of N-type semiconductor crystal 10, such as gallium arsenide, in order to make ohmic contact therewith. In addition, superimposed annuli of insulating material 30, such as silicon dioxide, and conducting material 31, such as aluminum, are next formed on the upper surface of semiconductor crystal 10 around the radiation responsive surface thereof. At this juncture, however, an intervening metallic layer 41 such as platinum, for example, is evaporated over aluminum annulus 31 and the radiation responsive surface of gallium arsenide crystal 10 at a temperature of 150° C. so as to form an abrupt metal-to-semiconductor interface 39 therewith. Thus, a Schottky barrier is formed between platinum layer 41 and crystal 10. Platinum layer 41 is evaporated to a thickness of between 50 and 200 angstroms in order to provide a high degree of transmissivity to incident radiation of the desired wavelength. Thereafter, a layer of silver 42 is evaporated to a thickness of about 2,000 angstroms onto platinum film 41 at a temperature of 150° C. A tarnish preventing magnesium fluoride layer 43 may thereafter be deposited to a thickness of between 1,000 and 2,000 angstroms atop silver film 42 by evaporation at a temperature of 150° C. A lead 44 is then attached to aluminum annulus 31 through solder 45, which may conveniently comprise lead; similarly; silver layer 13 on crystal 10 is soldered to Kovar header 15 through a lead solder 40. Although a lead solder is desirable because of its fairly high melting point, an even higher melting temperature solder may be used in place of lead solder 40 and 45, if desired.

The foregoing describes an electromagnetic radiation detector of high sensitivity and selectivity, having a thin metallic film thereon to produce a Schottky barrier in the detector and filter out electromagnetic radiation of unwanted wavelengths. The foregoing also describes a method of making such detectors, and a method of preventing a reaction between a thin silver film atop a semiconductor crystal employed as an electromagnetic radiation detector without detrimentally affecting the response characteristics of the detector.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

We claim:

1. An ultraviolet light radiation detector of high selectivity comprising:

a semiconductive crystal of N-type conductivity selected from the group consisting of silicon, zinc sulfide, zinc selenide, cadmium sulfide, gallium arsenide, gallium phosphide and silicon carbide; and a metallic film comprising a layer of silver of approximately 2,000 angstroms thickness coated atop one surface of said crystal to form an abrupt interface with said crystal, said layer of silver having a high transmissivity to ultraviolet light radiation in a band of wavelengths centered about 3,220 angstroms.

2. The ultraviolet light radiation detector of claim 1 further comprising a layer of a metal selected from the group consisting of platinum, tungsten, molybdenum and chromium having a thickness of between 50 and 200 angstroms and being intermediate said crystal and said layer of silver, said layer of metal forming an abrupt interface with said crystal.

3. The electromagnetic radiation detector of claim 2 including a protective insulating layer coated over said metallic film, said insulating layer having a thickness exhibiting minimum reflectivity at the transmission peak of said silver.

4. The electromagnetic radiation detector of claim 2 including an annulus of electrically insulating material atop one surface of said crystal, and an electrically conductive coating atop said annulus of insulating material, said electrically conductive coating being in electrical contact with said silver film.